(12) United States Patent
Wang et al.

(10) Patent No.: US 12,716,146 B2
(45) Date of Patent: Aug. 25, 2026

(54) PATTERNED ALUMINUM NITRIDE COMPOSITE SUBSTRATE AND PREPARATION METHOD THEREOF

(71) Applicants: Peking University, Beijing (CN); Sinopatt Technology Co., Ltd., Dongguan (CN)

(72) Inventors: Xinqiang Wang, Beijing (CN); Fang Liu, Beijing (CN); Kai Kang, Beijing (CN); Guoyi Zhang, Beijing (CN); Tongjun Yu, Beijing (CN); Ping Wang, Beijing (CN); Zirong Wang, Beijing (CN)

(73) Assignees: Peking University, Beijing (CN); Sinopatt Technology Co., Ltd., Dongguan (CN)

( * ) Notice: Subject to any disclaimer, the term of this patent is extended or adjusted under 35 U.S.C. 154(b) by 97 days.

(21) Appl. No.: 18/956,460

(22) Filed: Nov. 22, 2024

(65) Prior Publication Data

US 2026/0152873 A1 Jun. 4, 2026

(30) Foreign Application Priority Data

May 27, 2024 (CN) ......................... 202410660149.6

(51) Int. Cl.
*B32B 3/26* (2006.01)
*B23K 26/082* (2014.01)
(Continued)

(52) U.S. Cl.
CPC ............ *C30B 29/68* (2013.01); *B23K 26/082* (2015.10); *B23K 26/364* (2015.10); *B23K 26/402* (2013.01); *B23K 26/57* (2015.10); *B32B 3/26* (2013.01); *B32B 3/30* (2013.01); *C30B 1/026* (2013.01); *C30B 23/025* (2013.01);
(Continued)

(58) Field of Classification Search
CPC .... B32B 3/10; B32B 3/18; B32B 3/20; B32B 3/22; B32B 3/26; B32B 3/30; B32B 3/266; C30B 25/04; C30B 29/38; C30B 29/403
See application file for complete search history.

(56) References Cited

U.S. PATENT DOCUMENTS 10,514,500 B2 * 12/2019 Wang ..................... G02B 6/122
12,325,936 B2 * 6/2025 Kaneko ................ C30B 29/403
12,509,795 B2 * 12/2025 Kaneko ................ C30B 23/025

OTHER PUBLICATIONS

CN 107093657 Aug. 2017.*
CN 112510127 Mar. 2021.*

* cited by examiner

*Primary Examiner* — Elizabeth E Mulvaney
(74) *Attorney, Agent, or Firm* — WCF IP

(57) ABSTRACT

A patterned aluminum nitride (AlN) composite substrate and a preparation method thereof are provided. A single crystal AlN with a semi-suspended AlN structure is prepared on a high temperature-resistant substrate. A non-suspended AlN of the single crystal AlN is covered by an optical medium material while a suspended AlN is exposed. A surface of the suspended AlN with a low dislocation density and a low mismatch stress and distributed periodically is used as a nucleation growth zone of a nitride semiconductor. An epitaxial interface is changed from an AlN/high temperature-resistant substrate into a homogeneous or nearly-homogeneous interface between the nitride semiconductor and the AlN. In this way, the patterned AlN composite substrate is obtained.

10 Claims, 4 Drawing Sheets

(51) Int. Cl.

| | |
|---|---|
| ***B23K 26/364*** | (2014.01) |
| ***B23K 26/402*** | (2014.01) |
| ***B23K 26/57*** | (2014.01) |
| ***B32B 3/30*** | (2006.01) |
| ***C30B 1/02*** | (2006.01) |
| ***C30B 23/02*** | (2006.01) |
| ***C30B 23/04*** | (2006.01) |
| ***C30B 25/04*** | (2006.01) |
| ***C30B 25/18*** | (2006.01) |
| ***C30B 29/40*** | (2006.01) |
| ***C30B 29/68*** | (2006.01) |
| ***C30B 33/02*** | (2006.01) |
| ***C30B 33/04*** | (2006.01) |
| ***G03F 7/00*** | (2006.01) |
| ***G03F 7/16*** | (2006.01) |
| ***H10P 14/20*** | (2026.01) |
| *B23K 103/00* | (2006.01) |

(52) U.S. Cl.

CPC .............. *C30B 23/04* (2013.01); *C30B 25/04* (2013.01); *C30B 25/186* (2013.01); *C30B 29/406* (2013.01); *C30B 33/02* (2013.01); *C30B 33/04* (2013.01); *G03F 7/0005* (2013.01); *G03F 7/0035* (2013.01); *G03F 7/162* (2013.01); *H10P 14/3416* (2026.01); *H10P 14/3802* (2026.01); *B23K 2103/52* (2018.08)

PATTERNED ALUMINUM NITRIDE COMPOSITE SUBSTRATE AND PREPARATION METHOD THEREOF

CROSS-REFERENCE TO RELATED APPLICATION

This patent application claims the benefit and priority of Chinese Patent Application No. 202410660149.6, entitled "PATTERNED ALUMINUM NITRIDE COMPOSITE SUBSTRATE AND PREPARATION METHOD THEREOF" filed on May 27, 2024, the disclosure of which is incorporated by reference herein in its entirety as part of the present application.

TECHNICAL FIELD

The present disclosure relates to the technical field of preparation of group III nitride semiconductor substrates, and in particular to a patterned aluminum nitride (AlN) composite substrate and a preparation method thereof.

BACKGROUND

Nitride semiconductors represented by gallium nitride (GaN) and aluminum nitride (AlN) are preferred materials for preparing semiconductor light-emitting devices with high light efficiency and long service life, and have important applications in lighting display, sterilization and disinfection, precision processing, and confidential communications. A substrate could dominate and regulate the dislocation density and stress state of an epitaxial structure for the nitride semiconductor, and is a core link in determining the quality of thin film materials and the performance of light-emitting devices. The lack of homogeneous substrates means that nitride semiconductor-based ultraviolet light-emitting diodes (UV-LEDs) are generally made of sapphire substrates, patterned sapphire substrates, or flat AlN/sapphire composite substrates. For example, when using sapphire or patterned sapphire substrates, there are high degree of lattice mismatch (>10%) and thermal expansion coefficient mismatch (>30%) at an interface between the GaN or AlN and the sapphire. These mismatches may lead to both high mismatch stress and high dislocation density ($\geq 5\times10^{8}$ $cm^{-2}$) in the epitaxial structure of nitride semiconductor, which makes it difficult to achieve large-size, crack-free, and high-quality nitride semiconductor-based LED epitaxial wafers larger than 4 inches, resulting in limited light efficiency and low yield of the devices. In addition, an AlN/sapphire composite substrate with an AlN layer pre-deposited on a sapphire substrate can also be adopted. For example, the AlN/sapphire composite substrate is prepared by pre-depositing an AlN layer on a patterned sapphire substrate through physical vapor deposition (PVD). The pre-deposited AlN layer has a high c-axis orientation but poor in-plane orientation, and a GaN or AlN layer with a thickness of not less than 5 mm needs to be epitaxially extended to achieve dislocation filtration and lateral closure. In this way, an epitaxial structure of nitride semiconductor is obtained with a smooth surface, resulting in problems of nitride semiconductor-based LEDs such as high dislocation density, long epitaxial time, and high process cost. For another example, an AlN/sapphire composite substrate is prepared by pre-depositing an AlN layer on a flat sapphire substrate and then annealing at high temperature. The pre-deposited AlN layer has a single crystal structure, and an epitaxial structure of nitride semiconductor with a smooth surface can be obtained by epitaxially extending a GaN or AlN layer with a thickness of 1 μm to 2 μm. However, a highly-mismatched AlN/sapphire interface below leads to insufficient dislocation annihilation and lack of stress relaxation pathways in the pre-deposited AlN layer during high-temperature annealing. Therefore, the prepared nitride semiconductor-based LED with visible light or ultraviolet light show high dislocation density, stress-induced cracking, and insufficient luminous efficiency.

SUMMARY

In view of the above problems existing in the prior art, the present disclosure proposes a patterned AlN composite substrate and a preparation method thereof. A single crystal AlN with a semi-suspended AlN structure is prepared on a high temperature-resistant substrate. A non-suspended AlN of the single crystal AlN is covered by an optical medium material while a suspended AlN is exposed. An epitaxial interface is changed from an AlN/high temperature-resistant substrate into a homogeneous or nearly-homogeneous interface between the nitride semiconductor and the AlN. In this way, the patterned AlN composite substrate is obtained that could greatly reduce a dislocation density of the epitaxial structure and improve the performance of LED devices based on the nitride semiconductor.

An object of the present disclosure is to provide a patterned AlN composite substrate.

The present disclosure provides a patterned AlN composite substrate, including a high temperature-resistant substrate, a patterned bottom AlN, a semi-suspended AlN structure, and an optical medium material. The high temperature-resistant substrate has a single crystal structure with a band gap not less than 5.4 eV, and allows ultraviolet light in a band of 230 nm to 400 nm to penetrate through, and does not undergo surface decomposition at a high temperature in an inert atmosphere; primary AlN deposition is conducted on an upper surface of the high temperature-resistant substrate to form a bottom AlN, the bottom AlN has crystal defects at a high density, such that the bottom AlN has an absorption capability in an ultraviolet band; a laser beam in the ultraviolet band is incident from a back side on a lower surface of the high temperature-resistant substrate, and penetrates through the high temperature-resistant substrate to the bottom AlN, such that the bottom AlN absorbs the laser beam in the ultraviolet band and is decomposed into nitrogen and aluminum. The high temperature-resistant substrate was scanned with laser beam scans along a straight line, where a scanning path includes multiple scanning straight lines, and a spacing between two adjacent parallel scanning straight lines is at least twice a diameter of a laser spot; a zone on the bottom AlN scanned by the laser spot is an irradiated zone, the irradiated zone including multiple long strips, and two ends of each of the long strips passing through an edge of the bottom AlN; a zone on the bottom AlN not scanned by the laser spot is a non-irradiated zone, a width of the irradiated zone being not greater than a width of the non-irradiated zone, such that AlN in the irradiated zone is decomposed, while AlN in the non-irradiated zone is retained, AlN thereby forms a stripe-like or grid-like periodic distribution, forming the patterned bottom AlN. A primary photoresist is applied onto a surface of the patterned bottom AlN by spin coating, where the spin coating is continued after the primary photoresist fills the irradiated zone without AlN to cover the non-irradiated zone with AlN, and a surface of the primary photoresist is higher than a surface of the non-irradiated zone with AlN; the primary photoresist is exposed with a mask to light, a projection of a primary exposure zone falls within a projection of the non-irradiated zone, and a width of the primary exposure zone is less than a width of the non-irradiated zone; the primary photoresist in the primary exposure zone is removed, the primary photoresist in a non-primary exposure zone is retained, and a patterned primary photoresist is therefore formed on the surface of the patterned bottom AlN, a period of the patterned primary photoresist being consistent with a period of the patterned bottom AlN. Secondary AlN deposition is conducted on a surface of the patterned primary photoresist to form a top AlN, the top AlN continuously covers the primary exposure zone without the primary photoresist and the non-primary exposure zone with the primary photoresist retained, and a surface of the top AlN is higher than a surface of the primary photoresist retained in the non-primary exposure zone during the patterning the primary photoresist. The patterned primary photoresist in the non-primary exposure zone between the top AlN and the patterned bottom AlN is removed, AlN of the top AlN corresponding to the non-primary exposure zone is no longer supported by the primary photoresist and becomes a suspended AlN, and AlN of the top AlN corresponding to the primary exposure zone is supported by AlN retained in the patterned bottom AlN and becomes a non-suspended AlN, thereby forming the semi-suspended AlN structure. The patterned bottom AlN and the top AlN are recrystallized after high-temperature thermal annealing to form a single crystal AlN. A secondary photoresist is applied onto a surface of the single crystal AlN by spin coating, the secondary photoresist is exposed with the mask to light, and a secondary exposure zone is directly opposite to the suspended AlN. The secondary photoresist in the secondary exposure zone is removed, namely the secondary photoresist on the suspended AlN is removed, and a patterned secondary photoresist is formed on the surface of the single crystal AlN. The optical medium material is deposited on a surface of the patterned secondary photoresist; and the patterned secondary photoresist on the surface of the single crystal AlN is removed, such that a surface of the suspended AlN does not have the optical medium material while a surface of the non-suspended AlN has the optical medium material, thereby obtaining the patterned AlN composite substrate including the high temperature-resistant substrate, the single crystal AlN, and the optical medium material.

Another object of the present disclosure is to provide a method for preparing a patterned AlN composite substrate.

In the present disclosure, the method for preparing a patterned AlN composite substrate includes the following steps:

1) providing a high temperature-resistant substrate:

allowing the high temperature-resistant substrate, wherein the high temperature-resistant substrate has a single crystal structure with a band gap not less than 5.4 eV, allows ultraviolet light in a band of 230 nm to 400 nm to penetrate through, and does not undergo surface decomposition in an inert atmosphere at a high temperature;

2) conducting low-temperature and low-pressure primary AlN deposition:

conducting the low-temperature and low-pressure primary AlN deposition on an upper surface of the high temperature-resistant substrate at a deposition temperature of not greater than 700° C. under a deposition pressure of not greater than $1\times10^{-2}$ Pa to form a bottom AlN; where the deposition temperature of not greater than 700° C. causes the bottom AlN deposited on the high temperature-resistant substrate to have crystal defects at a high density, such that the bottom AlN has an absorption capability in an ultraviolet band;

3) patterning the bottom AlN:

allowing a laser beam in the ultraviolet band to be incident from a back side on a lower surface of the high temperature-resistant substrate, and penetrate through the high temperature-resistant substrate to the bottom AlN, such that the bottom AlN absorbs the laser beam in the ultraviolet band and then is decomposed into nitrogen and aluminum; controlling the laser beam to scan along a straight line with a scanning path including multiple scanning straight lines and a spacing between two adjacent parallel scanning straight lines being at least twice a diameter of a laser spot, wherein a zone on the bottom AlN scanned by the laser spot is an irradiated zone, the irradiated zone including multiple long strips, and two ends of each of the long strips passing through an edge of the bottom AlN; a zone on the bottom AlN not scanned by the laser spot is a non-irradiated zone, a width of the irradiated zone being not greater than a width of the non-irradiated zone, such that AlN in the irradiated zone is decomposed, and AlN in the non-irradiated zone is retained, and AlN thereby forms a stripe-like or grid-like periodic distribution, forming a patterned bottom AlN;

4) obtaining a patterned primary photoresist:

applying a primary photoresist onto a surface of the patterned bottom AlN by spin coating, where the spin coating is continued after the primary photoresist fills the irradiated zone without AlN to cover the non-irradiated zone with AlN, and a surface of the primary photoresist is higher than a surface of the non-irradiated zone with AlN; exposing the primary photoresist with a mask to light, where a projection of a primary exposure zone falls within a projection of the non-irradiated zone, and a width of the primary exposure zone is less than a width of the non-irradiated zone; and removing the primary photoresist in the primary exposure zone using a developing solution, meanwhile retaining the primary photoresist in a non-primary exposure zone, thereby forming the patterned primary photoresist on the surface of the patterned bottom AlN, where a period of the patterned primary photoresist is consistent with a period of the patterned bottom AlN;

5) conducting low-temperature and low-pressure secondary AlN deposition:

conducting the low-temperature and low-pressure secondary AlN deposition on a surface of the patterned primary photoresist at a deposition temperature of not greater than 700° C. under a deposition pressure of not greater than $1\times10^{-2}$ Pa to form a top AlN, wherein the top AlN continuously covers the primary exposure zone without the primary photoresist and the non-primary exposure zone with the primary photoresist retained, and a surface of the top AlN is higher than a surface of the primary photoresist retained in the non-primary exposure zone during the patterning the the patterned primary photoresist;

6) removing the patterned primary photoresist:

removing the patterned primary photoresist in the non-primary exposure zone between the top AlN and the patterned bottom AlN, such that AlN of the top AlN corresponding to the non-primary exposure zone is no longer supported by the primary photoresist and becomes a suspended AlN, and AlN of the top AlN corresponding to the primary exposure zone is supported by AlN retained in the patterned bottom AlN and becomes a non-suspended AlN, thereby forming a semi-suspended AlN structure;

7) conducting recrystallization after annealing:

subjecting the semi-suspended AlN structure to high-temperature thermal annealing in an inert atmosphere, and adjusting a temperature and a pressure such that the semi-suspended AlN structure is subjected to recrystallization but does not decompose, wherein the suspended AlN of the top AlN that corresponds to the irradiated zone is not affected by an interface lattice mismatch and a thermal expansion coefficient mismatch brought by the high temperature-resistant substrate, thus achieving annihilation of a dislocation density and relaxation of a mismatch stress, such that the suspended AlN after the high-temperature thermal annealing has a low dislocation density and a low mismatch stress; and recrystallizing the patterned bottom AlN and the top AlN after annealing to form a single crystal AlN;

8) obtaining a patterned secondary photoresist:

applying a secondary photoresist onto a surface of the single crystal AlN by spin coating, exposing the secondary photoresist with a mask to light, where a secondary exposure zone is directly opposite to the suspended AlN, and removing the secondary photoresist in the secondary exposure zone using a developing solution, namely removing the secondary photoresist on the suspended AlN, thereby forming the patterned secondary photoresist on the surface of the single crystal AlN;

9) conducting deposition of an optical medium material:

depositing an optical medium material on a surface of the patterned secondary photoresist to inhibit nucleation growth of a nitride semiconductor; and 10) removing the patterned secondary photoresist:

removing the patterned secondary photoresist on the surface of the single crystal AlN, such that a surface of the suspended AlN does not have the optical medium material while a surface of the non-suspended AlN has the optical medium material, thereby obtaining the patterned AlN composite substrate including the high temperature-resistant substrate, the single crystal AlN, and the optical medium material.

Further, a surface of the suspended AlN with a low dislocation density and a low mismatch stress and periodically distributed on the surface of the patterned AlN composite substrate is used as a nucleation growth zone of the nitride semiconductor; the optical medium material does not achieve high-oriented nucleation growth of the nitride semiconductor, and the nitride semiconductor on the suspended AlN grows vertically in an area surrounded by the optical medium material. Under the condition that a height of the nitride semiconductor exceeds a height of the optical medium material, simultaneous lateral growth and longitudinal growth are achieved, and the lateral growth achieves secondary annihilation of the dislocation density in the nitride semiconductor. Under the condition that the longitudinal height exceeds the height of the optical medium material by not less than 500 nm, a continuous nitride semiconductor film is formed with a dislocation density less than or equal to $2\times10^{7}$ $cm^{-2}$, such that a LED with visible light or ultraviolet light is prepared based on the nitride semiconductor. The nitride semiconductor is selected from the group consisting of GaN and AlN.

In some embodiments, in step 1), the high temperature-resistant substrate is double-sided polished. In some embodiments, the high temperature-resistant substrate has a transmittance of more than 99% for an incident light having a wavelength not less than 230 nm. In some embodiments, surface decomposition does not occur on the high temperature-resistant substrate at a high temperature under an inert atmosphere, and the high temperature-resistant substrate has a surface roughness less than or equal to 2 nm, the inert atmosphere being hydrogen, nitrogen, or a mixture of nitrogen and hydrogen, and the high temperature being not less than 1,400° C. In some embodiments, the high temperature-resistant substrate is made of sapphire, diamond, or boron nitride.

In some embodiments, in step 2), the primary AlN deposition is conducted by one selected from the group consisting of physical vapor deposition (PVD), molecular beam epitaxy (MBE), magnetron sputtering, electron beam evaporation (EBE), pulsed laser deposition (PLD), and atomic layer deposition (ALD). In some embodiments, the deposition temperature is in a range of 300° C. to 700° C., and the deposition pressure is in a range of $1\times10$ Pa to $1\times10^{-2}$ Pa. In some embodiments, the deposition rate is in a range of 1 nm/min to 15 nm/min, and the bottom AlN has a thickness of 10 nm to 100 nm. In some embodiments, the crystal defects include point defects and line defects, where the point defects have a density not less than $1\times10^{20}$ $cm^{-2}$, and the line defects have a density not less than $1\times10^{10}$ $cm^{-2}$, thereby having the ability to absorb ultraviolet light in a band range of 230 nm to 400 nm.

In some embodiments, in step 3), the laser beam in the ultraviolet light band has a power of 10 mW to 20 W. In some embodiments, the scanning path is in a stripe shape or a grid shape. In some embodiments, a stripe scanning path includes multiple parallel straight lines. In some embodiments, a grid scanning path includes two path groups, each of the two path groups includes multiple parallel straight lines, and the two path groups are perpendicular to each other. In some embodiments, an irradiated zone formed by the stripe scanning path includes multiple parallel long strips, forming a stripe-shaped patterned bottom AlN after irradiation. In some embodiments, an irradiated zone formed by the grid scanning path includes two zone groups, each of the two zone groups includes multiple parallel long strips, the long strips of the two zone groups are perpendicular to each other, forming a grid-shaped patterned bottom AlN after irradiation. In some embodiments, a width of the irradiated zone is 0.2 to 1.0 times a width of the non-irradiated zone. In some embodiments, the irradiated zone has a width of 1 mm to 50 mm.

In some embodiments, in step 4), the surface of the primary photoresist is 50 nm to 950 nm higher than the surface of the non-irradiated zone with AlN retained. In some embodiments, the width of the primary exposure zone is 0.2 to 0.8 times the width of the non-irradiated zone.

In some embodiments, in step 5), the secondary AlN deposition is conducted by one selected from the group consisting of PVD, MBE, magnetron sputtering, EBE, PLD, and ALD. In some embodiments, a deposition rate is in a range of 1 nm/min to 15 nm/min, and a deposition thickness is in a range of 50 nm to 400 nm. In some embodiments, the deposition temperature is in a range of 300° C. to 700° C., the deposition pressure is in a range of 1×10-6 Pa to $1\times10^{-2}$ Pa. In some embodiments, the surface of the top AlN is 50 nm to 950 nm higher than the surface of the primary photoresist.

In some embodiments, in step 6), the patterned primary photoresist in the non-primary exposure zone between the top AlN and the patterned bottom AlN is removed by heat treatment with an organic solution or ultrasonic cleaning.

In some embodiments, in step 7), an annealing temperature is in a range of 1,500° C. to 1,700° C. and an annealing pressure is in a range of 1.1 atm to 1.4 atm, such that the semi-suspended AlN structure is subjected to recrystallization but does not decompose. In some embodiments, the inert atmosphere of annealing is nitrogen or a mixture of nitrogen and hydrogen. In some embodiments, after the high-temperature thermal annealing, the AlN surface shows a decomposition thickness less than or equal to 5 nm. In some embodiments, after the high-temperature thermal annealing, the suspended AlN has a dislocation density less than or equal to $5\times10^{7}$ cm$^{-2}$ and a low mismatch stress less than or equal to 0.5 GPa. In some embodiments, the non-suspended AlN is affected by the high lattice mismatch and high thermal expansion coefficient mismatch of the AlN/high temperature-resistant substrate interface introduced by the high temperature-resistant substrate, and the dislocation density annihilation and mismatch stress relaxation processes are limited. In some embodiments, after the high-temperature thermal annealing, the non-suspended AlN has a dislocation density not less than $5\times10^{8}$ cm$^{-2}$ and a mismatch stress not less than 1.5 GPa.

In some embodiments, in step 8), the width of the secondary exposure zone is 0.5 to 1.5 times the width of the primary exposure zone. In some embodiments, the periodic distribution of the patterned secondary photoresist is consistent with the periodic distribution of the patterned primary photoresist, that is, the periodic distribution of the patterned bottom AlN.

In some embodiments, in step 9), the optical medium material has a thickness of 200 nm to 800 nm, and its optical refractive index is less than that of the high temperature-resistant substrate and that of the AlN. In some embodiments, the optical medium material is at least one selected from the group consisting of silicon oxide, aluminum oxide, titanium oxide, indium oxide, magnesium oxide, hafnium oxide, and zirconium oxide, and has an amorphous structure or a nearly-amorphous structure.

In some embodiments, in step 10), the patterned secondary photoresist on the semi-suspended AlN structure is removed by heat treatment with an organic solution, ultrasonic cleaning, or the like. The optical medium material obtained is also patterned, and has a pattern periodic distribution that is consistent with the periodic distribution of the patterned primary photoresist, that is, the periodic distribution of the patterned bottom AlN.

Embodiments of the present disclosure have the following advantages:

A single crystal AlN with a semi-suspended AlN structure is prepared on a high temperature-resistant substrate. A non-suspended AlN of the single crystal AlN is covered by an optical medium material while a suspended AlN is exposed. A non-suspended AlN of the single crystal AlN is covered by an optical medium material while a suspended AlN is exposed. A surface of the suspended AlN with a low dislocation density and a low mismatch stress and distributed periodically is used as a nucleation growth zone of a nitride semiconductor. An epitaxial interface is changed from an AlN/high temperature-resistant substrate into a homogeneous or nearly-homogeneous interface between the nitride semiconductor and the AlN. In this way, the patterned AlN composite substrate is obtained that could greatly reduce a dislocation density and a mismatch stress of the epitaxial structure and improve the performance of light-emitting diode (LED) devices based on the nitride semiconductor. The patterned AlN composite substrate is compatible with existing materials and device systems, has a low preparation cost, and is suitable for large-scale production of a substrate for the LED devices based on the nitride semiconductor, thereby obtaining nitride semiconductor-based LEDs with visible light or ultraviolet light.

In FIG. 1 to FIGS. 9, 1 represents a high temperature-resistant substrate; 02 represents a bottom AlN; 2 represents a patterned bottom AlN; 03 represents a primary photoresist; 3 represents a patterned primary photoresist; 04 represents a top AlN; 4 represents a semi-suspended AlN structure; 5 represents a single crystal AlN; and 6 represents an optical medium material.

DETAILED DESCRIPTION OF THE EMBODIMENTS

The present disclosure is further described below with reference to the specific examples and accompanying drawings.

In the example, the method for preparing a patterned AlN composite substrate consisted of the following steps:

1) Providing a High Temperature-Resistant Substrate

Figure 1:
FIG. 1 shows a cross-sectional view of the high temperature-resistant substrate prepared according to an example of the method for preparing a patterned AlN composite substrate in the present disclosure.
Figure 1:
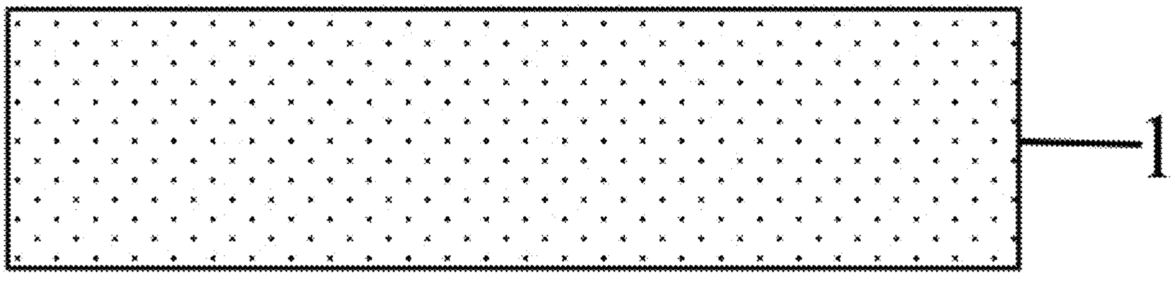

The high temperature-resistant substrate 1 was made of sapphire, as shown in FIG. 1, was a single crystal with a band gap ≥5.4 eV, and allowed ultraviolet light in a band of 230 nm to 400 nm to penetrate through with a transmittance of over 99%, and serious surface decomposition did not occur at a high temperature of more than 1,400° C. in an inert atmosphere (a mixture of nitrogen and hydrogen). The high temperature-resistant substrate 1 had a surface roughness ≤2 nm with double sides polished.

2) Conducting Low-Temperature and Low-Pressure Primary AlN Deposition

Figure 2:
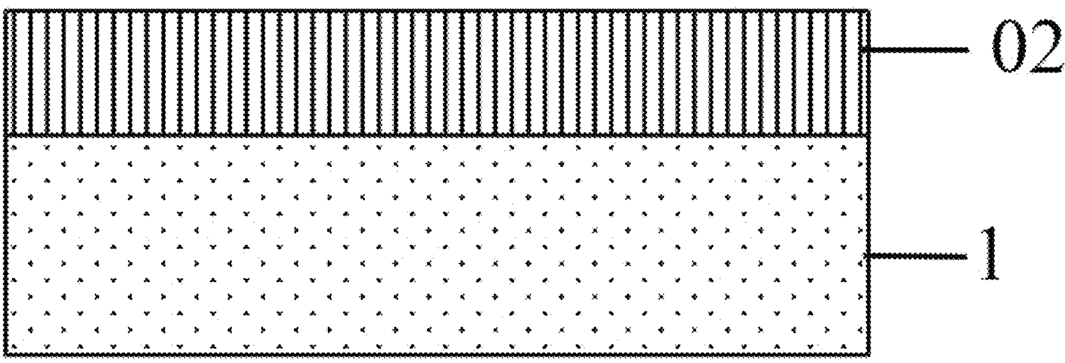
FIG. 2 shows a cross-sectional view of the bottom AlN prepared according to an example of the method for preparing a patterned AlN composite substrate in the present disclosure.

The low-temperature and low-pressure primary AlN deposition was conducted by PVD on an upper surface of the high temperature-resistant substrate at a deposition temperature of 600° C. under a deposition pressure of $1\times10^{-3}$ Pa with a deposition rate of 10 nm/min to form a bottom AlN 02 with a thickness of 80 nm, as shown in FIG. 2. The lower deposition temperature resulted in the presence of high-density crystal defects in the bottom AlN deposited on the high temperature-resistant substrate; the crystal defects consisted of point defects and line defects, the point defects had a density $\geq1\times10^{20}$ $cm^{-2}$, and the line defects had a density $\geq1\times10^{10}$ $cm^{-2}$, thereby having the ability to absorb ultraviolet light in a band range of 230 nm to 400 nm.

3) Patterning the Bottom AlN

Figure 3:
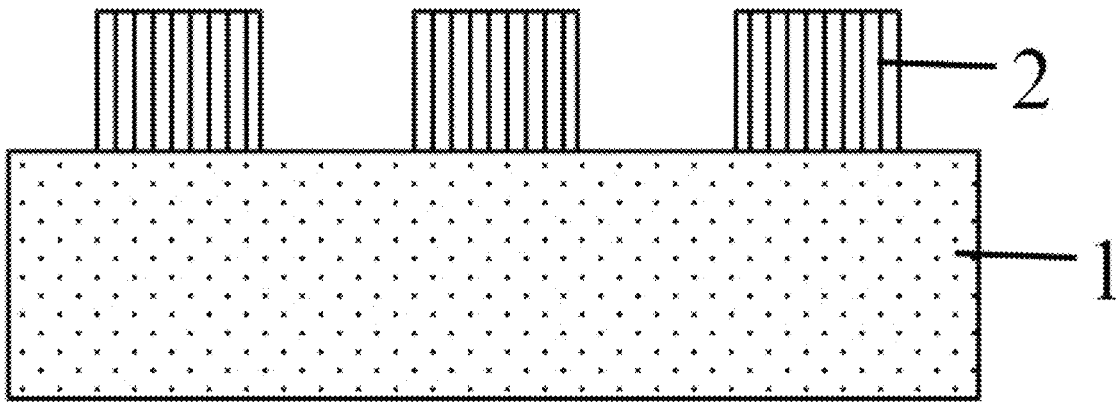
FIG. 3 shows a cross-sectional view of the patterned bottom AlN prepared according to an example of the method for preparing a patterned AlN composite substrate in the present disclosure.

A laser beam of 10 W in the ultraviolet band was incident from a back side on a lower surface of the high temperature-resistant substrate, and penetrated through the high temperature-resistant substrate to the bottom AlN, such that the bottom AlN absorbed the laser beam in the ultraviolet band and decomposed into nitrogen and aluminum. The bottom AlN was scanned with the laser beam along a straight line, a scanning path was stripe-shaped, including multiple parallel straight lines, and a spacing between two adjacent parallel scanning straight lines was at least twice a diameter of a laser spot; a zone on the bottom AlN scanned by the laser spot was an irradiated zone, the irradiated zone consisted of multiple long strips, and two ends of each of the long strips passed through an edge of the bottom AlN; a zone on the bottom AlN not scanned by the laser spot was a non-irradiated zone, a width of the irradiated zone was 0.8 times a width of the non-irradiated zone; the irradiated zone had a width of 2 μm, AlN in the irradiated zone was decomposed, while AlN in the non-irradiated zone was retained, such that AlN formed a stripe-like periodic distribution, forming the patterned bottom AlN 2, as shown in FIG. 3.

4) Obtaining a Patterned Primary Photoresist

Figure 4:
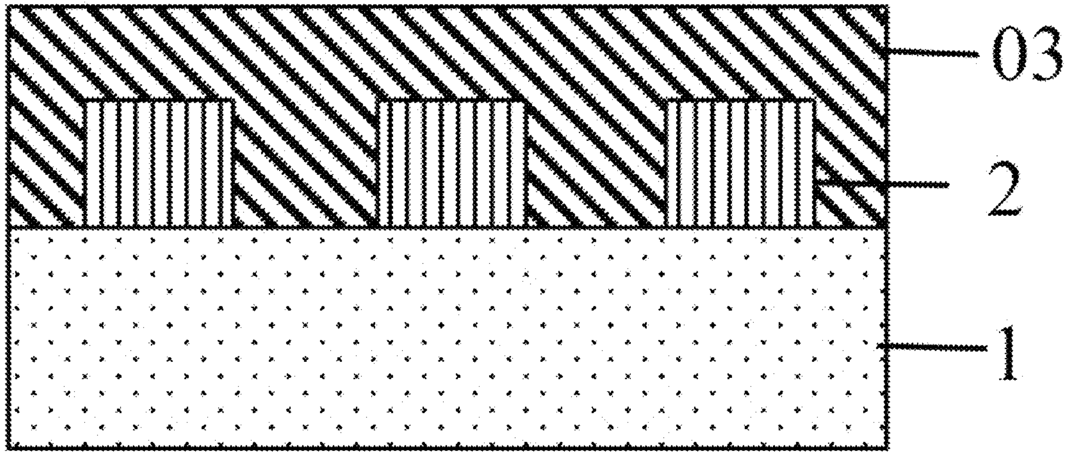
FIG. 4 shows a cross-sectional view of the primary photoresist by spin coating prepared according to an example of the method for preparing a patterned AlN composite substrate in the present disclosure.
Figure 5:
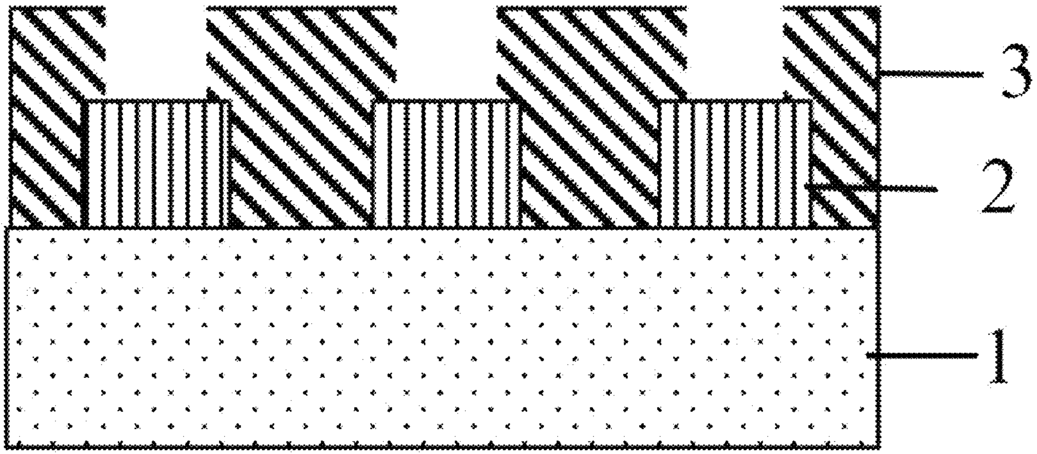
FIG. 5 shows a cross-sectional view of the patterned primary photoresist prepared according to an example of the method for preparing a patterned AlN composite substrate in the present disclosure.

A primary photoresist 03 was applied onto a surface of the patterned bottom AlN by spin coating, the spin coating was continued after the primary photoresist filled the irradiated zone without AlN to cover the non-irradiated zone with AlN, and a surface of the primary photoresist was higher than a surface of the non-irradiated zone with AlN by 100 nm, as shown in FIG. 4. The primary photoresist was exposed with a mask to light, a zone exposed in the primary photoresist was the primary exposure zone, while a zone not exposed was the non-primary exposure zone; a projection of the primary exposure zone along a direction perpendicular to the surface fell within a projection of the non-irradiated zone, a projection direction was perpendicular to the surface, and a width of the primary exposure zone was 0.6 times a width of the non-irradiated zone; the primary photoresist on the surface of primary exposure zone was removed using a developing solution, the primary photoresist on the surface of a non-primary exposure zone was retained, the patterned primary photoresist 3 was formed on the surface of the patterned bottom AlN, and a periodic distribution of the patterned primary photoresist was consistent with a periodic distribution of the patterned bottom AlN, as shown in FIG. 5.

5) Conducting Low-Temperature and Low-Pressure Secondary AlN Deposition

Figure 6:
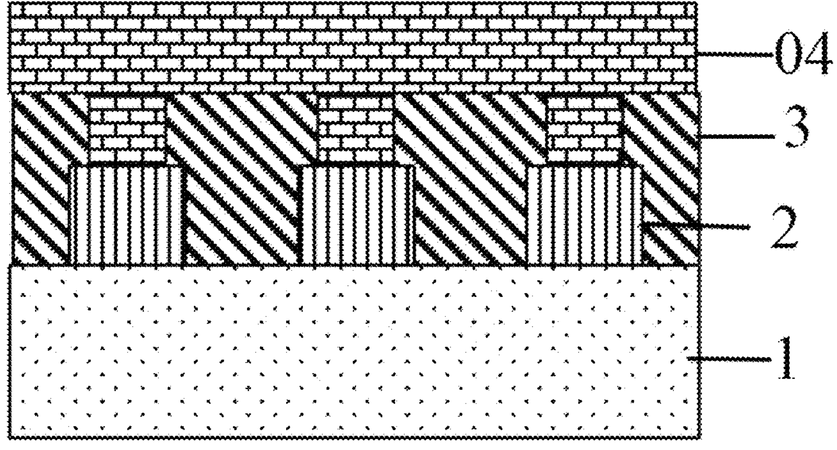
FIG. 6 shows a cross-sectional view of the top AlN prepared according to an example of the method for preparing a patterned AlN composite substrate in the present disclosure.

The low-temperature and low-pressure secondary AlN deposition was conducted by PVD on a surface of the patterned primary photoresist at a deposition temperature of 600° C. under a deposition pressure of not greater than $1\times10^{-3}$ Pa with a deposition rate of 10 nm/min to form a top AlN 04, with a thickness of 200 nm, as shown in FIG. 6. The top AlN continuously covered the primary exposure zone without the primary photoresist and the non-primary exposure zone with the primary photoresist retained, and a surface of the top AlN was higher than a surface of the primary photoresist retained in the non-primary exposure zone during the patterning the primary photoresist.

6) Removing the Patterned Primary Photoresist

Figure 7:
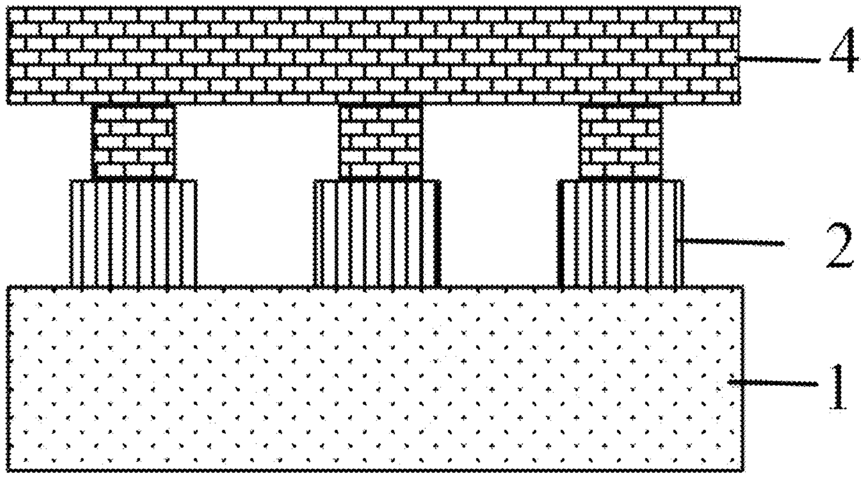
FIG. 7 shows a cross-sectional view of the semi-suspended AlN structure prepared according to an example of the method for preparing a patterned AlN composite substrate in the present disclosure.

The patterned primary photoresist on the surface of non-primary exposure zone between the top AlN and the patterned bottom AlN was removed by heat treatment with an organic solution or ultrasonic cleaning, AlN of the top AlN corresponding to the non-primary exposure zone was no longer supported by the primary photoresist and became a suspended AlN, and AlN of the top AlN corresponding to the primary exposure zone was supported by AlN retained in the patterned bottom AlN and became a non-suspended AlN, thereby forming a semi-suspended AlN structure 4, as shown in FIG. 7.

7) Conducting Recrystallization After Annealing

Figure 8:
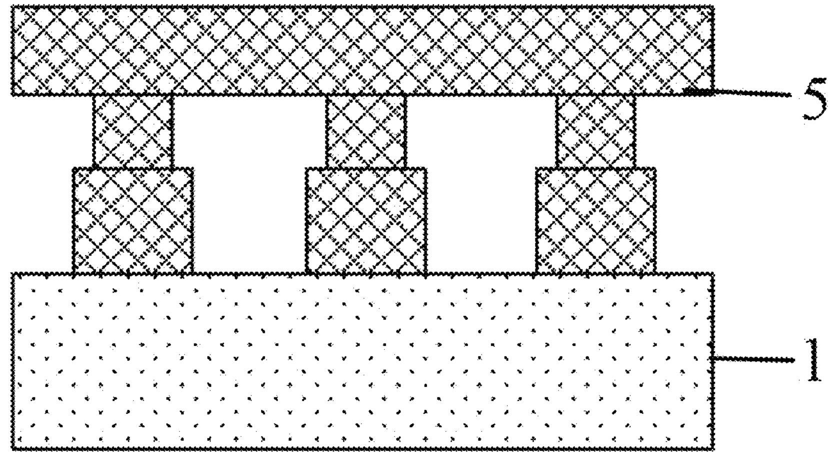
FIG. 8 shows a cross-sectional view of the single crystal AlN prepared according to an example of the method for preparing a patterned AlN composite substrate in the present disclosure.

At an annealing temperature of 1,700° C. and an annealing pressure of 1.2 atm in an inert atmosphere of nitrogen or a mixture of nitrogen and hydrogen, the semi-suspended AlN structure was subjected to high-temperature thermal annealing, and a temperature and a pressure were adjusted such that the semi-suspended AlN structure was subjected to recrystallization and did not decompose; the suspended AlN of the top AlN that corresponds to the irradiated zone was not affected by a high interface lattice mismatch and a high thermal expansion coefficient mismatch brought by the high temperature-resistant substrate, thus achieving significant annihilation of a dislocation density and significant relaxation of a mismatch stress, such that the suspended AlN after the high-temperature thermal annealing had a low dislocation density and a low mismatch stress; and the patterned bottom AlN and the top AlN were recrystallized after annealing to form a single crystal AlN 5, as shown in FIG. 8. AlN after the high-temperature thermal annealing had a decomposition thickness of ≤5 nm on the surface, and the suspended AlN after the high-temperature thermal annealing had a dislocation density of $\leq5\times10^{7}$ $cm^{-2}$ and a low mismatch stress of ≤0.5 GPa. The non-suspended AlN was affected by the high lattice mismatch and high thermal expansion coefficient mismatch of the AlN/high temperature-resistant substrate interface introduced by the high temperature-resistant substrate, and its dislocation density annihilation and mismatch stress relaxation processes were limited. The non-suspended AlN after high-temperature thermal annealing had a dislocation density of $\geq 5\times10^{8}$ $cm^{-2}$ and a mismatch stress of ≥1.5 GPa;

8) Obtaining a Patterned Secondary Photoresist

A secondary photoresist was applied onto a surface of the single crystal AlN by spin coating, the secondary photoresist was exposed with the mask to light, a zone exposed in the secondary photoresist was the secondary exposure zone; a secondary exposure zone was directly opposite to the suspended AlN, and a width of the secondary exposure zone was equal to a width of the primary exposure zone; the secondary photoresist on the surface of the secondary exposure zone was removed using the developing solution, namely the secondary photoresist on the suspended AlN was removed, and the patterned secondary photoresist was formed on the surface of the single crystal AlN; a periodic distribution of the patterned secondary photoresist was consistent with a periodic distribution of the patterned primary photoresist, that is, a periodic distribution of the patterned bottom AlN.

9) Conducting Deposition of an Optical Medium Material

The optical medium material was deposited on a surface of the patterned secondary photoresist at a thickness of 300 nm to inhibit nucleation growth of a nitride semiconductor. An optical refractive index was smaller than that of the high temperature-resistant substrate and that of AlN, and the optical medium material was silicon oxide.

10) Removing the Patterned Secondary Photoresist

Figure 9:
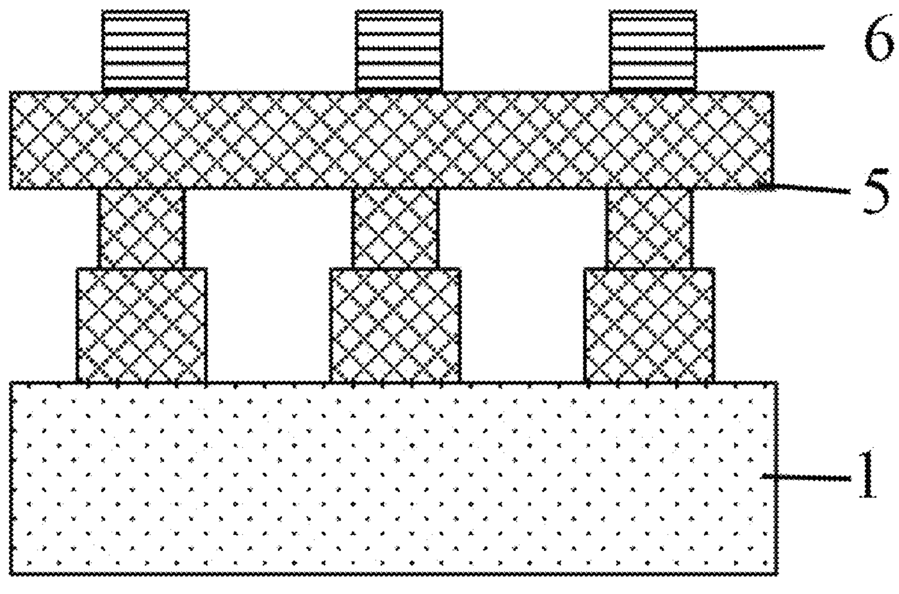
FIG. 9 shows a cross-sectional view of the patterned AlN composite substrate prepared according to an example of the method for preparing a patterned AlN composite substrate in the present disclosure.

The patterned secondary photoresist on the surface of the semi-suspended AlN structure was removed by heat treatment with an organic solution, such that a surface of the suspended AlN did not have the optical medium material while a surface of the non-suspended AlN had the optical medium material 6. The optical medium material was also patterned, and a periodic distribution of the pattern was consistent with a periodic distribution of the patterned primary photoresist, that was, a periodic distribution of the patterned bottom AlN, thereby obtaining the patterned AlN composite substrate consisting of the high temperature-resistant substrate, the single crystal AlN, and the optical medium material, as shown in FIG. 9.

Further, the suspended AlN with a low dislocation density and a low mismatch stress and periodically distributed on the surface of the patterned AlN composite substrate was used as a nucleation growth zone of the nitride semiconductor; the optical medium material did not achieve high-oriented nucleation growth of the nitride semiconductor, and the nitride semiconductor on the suspended AlN grew vertically in an area surrounded by the optical medium material. Under the condition that a height of the nitride semiconductor exceeded that of the optical medium material, simultaneous lateral growth and longitudinal growth were achieved, and the lateral growth achieved secondary annihilation of the dislocation density in the epitaxial structure of nitride semiconductor. Under the condition that the height of the nitride semiconductor exceeded that of the optical medium material by not less than 500 nm, a continuous nitride semiconductor film was formed with a dislocation density less than or equal to $2\times10^{7}$ $cm^{-2}$, such that a LED with visible light or ultraviolet light was prepared based on the nitride semiconductor. The nitride semiconductor was selected from the group consisting of GaN and AlN.

Finally, it should be noted that disclosure of the embodiments is intended to help further understand the present disclosure. Those skilled in the art could understand that various substitutions and modifications may be made without departing from the spirit and scope of the present disclosure and the appended claims. Therefore, the present disclosure should not be limited to the content disclosed in the embodiments, and the scope of protection claimed by the present disclosure is subject to the scope defined by the claims.

What is claimed is:

1. A patterned aluminum nitride (AlN) composite substrate, comprising a high temperature-resistant substrate, a patterned bottom AlN, a semi-suspended AlN structure, and an optical medium material; wherein the high temperature-resistant substrate has a single crystal structure with a band gap not less than 5.4 eV, allows ultraviolet light in a band of 230 nm to 400 nm to penetrate through, and does not undergo surface decomposition in an inert atmosphere at a high temperature;

a bottom AlN is formed through primary AlN deposition on an upper surface of the high temperature-resistant substrate, and has crystal defects at a high density such that the bottom AlN has an absorption capability in an ultraviolet band; a laser beam in the ultraviolet band that is incident from a back side on a lower surface of the high temperature-resistant substrate is capable of penetrating through the high temperature-resistant substrate to the bottom AlN, such that the bottom AlN absorbs the laser beam in the ultraviolet band and is decomposed into nitrogen and aluminum;

the patterned bottom AlN is formed by scanning with the laser beam along a straight line with a scanning path comprising multiple scanning straight lines, and a spacing between two adjacent parallel scanning straight lines being at least twice a diameter of a laser spot, wherein a zone on the bottom AlN scanned by the laser spot is an irradiated zone, the irradiated zone comprising multiple long strips, and two ends of each of the long strips passing through an edge of the bottom AlN; and a zone on the bottom AlN not scanned by the laser spot is a non-irradiated zone, a width of the irradiated zone being not greater than a width of the non-irradiated zone, such that AlN in the irradiated zone is decomposed, while AlN in the non-irradiated zone is retained, and AlN thereby forms a stripe-like or grid-like periodic distribution;

a primary photoresist is applied onto a surface of the patterned bottom AlN by spin coating, wherein the spin coating is continued after the primary photoresist fills the irradiated zone without AlN to cover the non-irradiated zone with AlN, and a surface of the primary photoresist is higher than a surface of the non-irradiated zone with AlN; the primary photoresist is exposed with a mask to light, wherein a projection of a primary exposure zone falls within a projection of the non-irradiated zone, and a width of the primary exposure zone is less than a width of the non-irradiated zone, such that the primary photoresist in the primary exposure zone is removed, the primary photoresist in a non-primary exposure zone is retained, and a patterned primary photoresist is formed on the surface of the patterned bottom AlN, and a periodic distribution of the patterned primary photoresist is consistent with a periodic distribution of the patterned bottom AlN;

a top AlN is formed by conducting secondary AlN deposition on a surface of the patterned primary photoresist, wherein the top AlN continuously covers the primary exposure zone without the primary photoresist and the non-primary exposure zone with the primary photoresist retained, and a surface of the top AlN is higher than a surface of the primary photoresist retained in the non-primary exposure zone during the patterning the primary photoresist;

the primary photoresist in the non-primary exposure zone between the top AlN and the patterned bottom AlN is removed, such that AlN of the top AlN corresponding to the non-primary exposure zone is no longer supported by the primary photoresist and becomes a suspended AlN, and AlN of the top AlN corresponding to the primary exposure zone is supported by AlN retained in the patterned bottom AlN and becomes a non-suspended AlN, thereby forming the semi-suspended AlN structure;

the patterned bottom AlN and the top AlN are recrystallized after high-temperature thermal annealing to form a single crystal AlN;

a secondary photoresist is applied onto a surface of the single crystal AlN by spin coating, and the secondary photoresist is exposed with a mask to light, wherein a secondary exposure zone is directly opposite to the suspended AlN; the secondary photoresist in the secondary exposure zone is removed, namely the secondary photoresist on the suspended AlN is removed, and a patterned secondary photoresist is formed on the surface of the single crystal AlN; and the optical medium material is deposited on a surface of the patterned secondary photoresist; and the patterned secondary photoresist on the surface of the single crystal AlN is removed, such that a surface of the suspended AlN does not have the optical medium material while a surface of the non-suspended AlN has the optical medium material, thereby obtaining the patterned AlN composite substrate comprising the high temperature-resistant substrate, the single crystal AlN, and the optical medium material.

2. The patterned AlN composite substrate as claimed in claim 1, wherein the high temperature-resistant substrate is made from a material selected from the group consisting of sapphire, diamond, and boron nitride.

3. A method for preparing a patterned AlN composite substrate, comprising:

1) providing a high temperature-resistant substrate, wherein the high temperature-resistant substrate has a single crystal structure with a band gap not less than 5.4 eV, allows ultraviolet light in a band of 230 nm to 400 nm to penetrate through, and does not undergo surface decomposition in an inert atmosphere at a high temperature;

2) conducting low-temperature and low-pressure primary AlN deposition:

conducting the low-temperature and low-pressure primary AlN deposition on an upper surface of the high temperature-resistant substrate at a deposition temperature of not greater than 700° C. under a deposition pressure of not greater than $1\times10^{-2}$ Pa to form a bottom AlN; wherein the deposition temperature of not greater than 700° C. causes the bottom AlN deposited on the high temperature-resistant substrate to have crystal defects at a high density, such that the bottom AlN has an absorption capability in an ultraviolet band;

3) patterning the bottom AlN:

allowing a laser beam in the ultraviolet band to be incident from a back side on a lower surface of the high temperature-resistant substrate, and penetrate through the high temperature-resistant substrate to the bottom AlN, such that the bottom AlN absorbs the laser beam in the ultraviolet band and then is decomposed into nitrogen and aluminum; and controlling the laser beam to scan along a straight line with a scanning path comprising multiple scanning straight lines and a spacing between two adjacent parallel scanning straight lines being at least twice a diameter of a laser spot, wherein a zone on the bottom AlN scanned by the laser spot is an irradiated zone, the irradiated zone comprising multiple long strips, and two ends of each of the long strips passing through an edge of the bottom AlN; and a zone on the bottom AlN not scanned by the laser spot is a non-irradiated zone, a width of the irradiated zone being not greater than a width of the non-irradiated zone, such that AlN in the irradiated zone is decomposed, and AlN in the non-irradiated zone is retained, and AlN thereby forms a stripe-like or grid-like periodic distribution, forming a patterned bottom AlN;

4) obtaining a patterned primary photoresist:

applying a primary photoresist onto a surface of the patterned bottom AlN by spin coating, wherein the spin coating is continued after the primary photoresist fills the irradiated zone without AlN to cover the non-irradiated zone with AlN, and a surface of the primary photoresist is higher than a surface of the non-irradiated zone with AlN;

exposing the primary photoresist with a mask to light, wherein a projection of a primary exposure zone falls within a projection of the non-irradiated zone, and a width of the primary exposure zone is less than a width of the non-irradiated zone; and removing the primary photoresist in the primary exposure zone using a developing solution, meanwhile retaining the primary photoresist in a non-primary exposure zone, thereby forming the patterned primary photoresist on the surface of the patterned bottom AlN, wherein a period of the patterned primary photoresist is consistent with a period of the patterned bottom AlN;

5) conducting low-temperature and low-pressure secondary AlN deposition:

conducting the low-temperature and low-pressure secondary AlN deposition on a surface of the patterned primary photoresist at a deposition temperature of not greater than 700° C. under a deposition pressure of not greater than $1\times10^{-2}$ Pa to form a top AlN, wherein the top AlN continuously covers the primary exposure zone without the primary photoresist and the non-primary exposure zone with the primary photoresist retained; and a surface of the top AlN is higher than a surface of the primary photoresist retained in the non-primary exposure zone during the patterning the primary photoresist;

6) removing the patterned primary photoresist:

removing the patterned primary photoresist in the non-primary exposure zone between the top AlN and the patterned bottom AlN, such that AlN of the top AlN corresponding to the non-primary exposure zone is no longer supported by the primary photoresist and becomes a suspended AlN, and AlN of the top AlN corresponding to the primary exposure zone is supported by AlN retained in the patterned bottom AlN and becomes a non-suspended AlN, thereby forming a semi-suspended AlN structure;

7) annealing and then recrystallizing:

subjecting the semi-suspended AlN structure to high-temperature thermal annealing in an inert atmosphere, and adjusting a temperature and a pressure such that the semi-suspended AlN structure is recrystallized and meanwhile does not decompose, wherein the suspended AlN of the top AlN that corresponds to the irradiated zone is not affected by an interface lattice mismatch and a thermal expansion coefficient mismatch brought by the high temperature-resistant substrate, thus achieving annihilation of a dislocation density and relaxation of a mismatch stress, such that the suspended AlN after the high-temperature thermal annealing has a low dislocation density and a low mismatch stress; and recrystallizing the patterned bottom AlN and the top AlN after annealing to form a single crystal AlN;

8) obtaining a patterned secondary photoresist:

applying a secondary photoresist onto a surface of the single crystal AlN by spin coating, exposing the secondary photoresist with a mask to light, wherein a secondary exposure zone is directly opposite to the suspended AlN; and removing the secondary photoresist in the secondary exposure zone using a developing solution, namely removing the secondary photoresist on the suspended AlN, thereby forming the patterned secondary photoresist on the surface of the single crystal AlN;

9) conducting deposition of an optical medium material:

depositing the optical medium material on a surface of the patterned secondary photoresist to inhibit nucleation growth of a nitride semiconductor; and 10) removing the patterned secondary photoresist:

removing the patterned secondary photoresist on the surface of the single crystal AlN, such that a surface of the suspended AlN does not have the optical medium material while a surface of the non-suspended AlN has the optical medium material, thereby obtaining the patterned AlN composite substrate comprising the high temperature-resistant substrate, the single crystal AlN, and the optical medium material.

4. The method as claimed in claim 3, wherein in step 2), the primary AlN deposition is performed by one selected from the group consisting of physical vapor deposition (PVD), molecular beam epitaxy (MBE), magnetron sputtering, electron beam evaporation (EBE), pulsed laser deposition (PLD), and atomic layer deposition (ALD).

5. The method as claimed in claim 3, wherein in step 3), the scanning path is in a stripe shape or a grid shape; a stripe scanning path comprises multiple parallel straight lines; a grid scanning path comprises two path groups, each of the two path groups comprises multiple parallel straight lines, and the two path groups are perpendicular to each other; an irradiated zone formed by the stripe scanning path comprises multiple parallel long strips, forming a stripe-shaped patterned bottom AlN after irradiation; an irradiated zone formed by the grid scanning path comprises two zone groups, each of the two zone groups comprises multiple parallel long strips, the long strips of the two zone groups are perpendicular to each other, forming a grid-shaped patterned bottom AlN after irradiation; and a width of the irradiated zone is 0.2 to 1.0 times a width of the non-irradiated zone.

6. The method as claimed in claim 3, wherein in step 4), the surface of the primary photoresist is 50 nm to 950 nm higher than the surface of the non-irradiated zone with AlN retained, and the width of the primary exposure zone is 0.2 to 0.8 times the width of the non-irradiated zone.

7. The method as claimed in claim 3, wherein in step 5), the secondary AlN deposition is performed by one selected from the group consisting of PVD, MBE, magnetron sputtering, EBE, PLD, and ALD.

8. The method as claimed in claim 3, wherein in step 6), the primary photoresist in the non-primary exposure zone between the top AlN and the patterned bottom AlN is removed by heat treatment with an organic solution or ultrasonic cleaning.

9. The method as claimed in claim 3, wherein in step 7), adjusting the temperature and the pressure is performed by: adjusting the temperature to an annealing temperature of 1,500° C. to 1,700° C., and adjusting the pressure to an annealing pressure of 1.1 atm to 1.4 atm, such that the semi-suspended AlN structure is recrystallized and meanwhile not decomposed.

10. The method as claimed in claim 3, further comprising:

using the suspended AlN with a low dislocation density and a low mismatch stress periodically distributed on a surface of the patterned AlN composite substrate as a nucleation growth zone of a nitride semiconductor; wherein the optical medium material does not result in high-oriented nucleation growth of the nitride semiconductor, and the nitride semiconductor grows vertically on the suspended AlN in an area surrounded by the optical medium material, and simultaneously laterally and longitudinally grows under the condition that a height of the nitride semiconductor exceeds a height of the optical medium material, a lateral growth achieves secondary annihilation of a dislocation density in the nitride semiconductor; under the condition that the height of the nitride semiconductor exceeds a height of the optical medium material by not less than 500 nm, a continuous nitride semiconductor film is formed, such that a nitride semiconductor light-emitting diode with visible light or ultraviolet light is prepared based on the nitride semiconductor.

* * * * *